United States Patent [19]

Asano et al.

[11] 4,188,707

[45] Feb. 19, 1980

[54] SEMICONDUCTOR DEVICES AND METHOD OF MANUFACTURING THE SAME

[75] Inventors: Masaru Asano, Tokyo; Tetsushi Sakai, Sayama; Yoshio Sunohara, Kodaira, all of Japan

[73] Assignee: Nippon Telegraph and Telephone Public Corporation, Tokyo, Japan

[21] Appl. No.: 814,552

[22] Filed: Jul. 11, 1977

[30] Foreign Application Priority Data

Jul. 15, 1976 [JP] Japan .................................. 51-83493

[51] Int. Cl.$^2$ ............................................ B01J 17/00
[52] U.S. Cl. ....................................... 29/571; 29/578; 29/579; 29/591; 357/59
[58] Field of Search ................ 29/571, 578, 579, 591; 357/59

[56] References Cited

U.S. PATENT DOCUMENTS

| | | | |
|---|---|---|---|
| 3,481,030 | 12/1969 | Te Velde | 29/579 |
| 4,016,587 | 4/1977 | De La Moneda | 357/59 |
| 4,057,820 | 11/1977 | Gallagher | 357/59 |

*Primary Examiner*—W. C. Tupman
*Attorney, Agent, or Firm*—Charles E. Pfund

[57] ABSTRACT

The semiconductor device comprises a semiconductor substrate, a polycrystalline silicon semiconductor body extending upwardly from a portion of the surface of the semiconductor substrate and containing an impurity at a substantially uniform concentration, and a metal electrode disposed on the top surface of the polycrystalline silicon semiconductor body. The metal electrode extends in the lateral direction beyond the periphery of the top surface of the polycrystalline silicon semiconductor body.

7 Claims, 31 Drawing Figures

SEMICONDUCTOR DEVICES AND METHOD OF MANUFACTURING THE SAME

BACKGROUND OF THE INVENTION

This invention relates to a semiconductor device, more particularly, a semiconductor device of the type wherein one of the electrodes is formed on a polycrystalline silicon body extending upwardly from a semiconductor substrate and a method of manufacturing the same.

In the manufacture of various semiconductor device, such as transistors and integrated circuits improvement of fine and highly accurate working technique has been strongly desired for the purpose of improving their characteristics. Especially, for improving the high frequency characteristics of bipolar silicon transistors for use in ultra high frequencies it is necessary to provide near construction and working technique for increasing the cutoff frequency and decreasing the base resistance and the collector-base junction capacitance.

However, in the prior art transistor of this type since the emitter, base and collector electrodes are formed on the same plane it is usual to install these electrodes at a spacing of about one micron for the purpose of electrically insulating them from each other. It has been recognized that when the spacing is made smaller, the transistor can be operated at higher frequencies. However, such spacing is limited by the accuracy of a photomask.

More particularly, among the problems regarding the photomask are included (a) the dimensional accuracy of a device pattern formed on a photomask, (b) the pitch accuracy of the device pattern formed on the photomask and (c) the accuracy of alignment between the device pattern already formed on a semiconductor wafer and device pattern of the photomask to be subsequently used. For this reason, when designing a photomask it is necessary to prepare the photomask having ample dimensions of the device pattern which permit respective errors in the accuracies described above. Where a device pattern having a small allowancce for the alignment of the semiconductor wafer and the photomask is used with sacrifice of the yield, and the alignment is made carefully with a sufficient time, the chance of contaminating and damaging the semiconductor wafer increases and the characteristics of the resulting semiconductor device are degraded.

Furthermore, the working of metal films which are used to form electrodes also affects fine and highly accurate working. More particularly, in order to obtain an electrode having a large current capacity the electrode should have a correspondingly larger cross-sectional area so that where the pattern width is limited due to design consideration, the thickness of the metal film to be worked becomes thick. When a thick metal film is etched a remarkable undercut appears thus making it difficult to attain the desired high accuracy of working.

Even when a skilled engineer carefully works there are errors of about ±0.2 micron in the dimension of the device pattern on the photomask, about ±0.3 micron in the device pattern pitch, and about ±0.3 micron in the alignment, namely an error of total of about ±0.8 micron. In addition, it is neccessary to take into consideration errors in the dimensions of the device pattern on the photomask, a photoresist pattern which is formed by baking the device pattern on the photoresist film and then developing, and a pattern formed by etching the substrate of the mask by using the photoresist pattern. In this manner, when photoetching technique is used to obtain products having dimensions of the order of microns it is inevitable to accompany dimensional errors.

In the case of an integrated circuit, lead wires for interconnecting various electrodes should be arranged on a plane with insulating spacings therebetween or in multilayers with insulator layers interposed therebetween.

For the purpose of improving the characteristics of the integrated circuit it has been proposed to dispose in the longitudinal direction one of the electrodes which have been arranged in the same plane with respect to other electrodes thereby eliminating the spacing between electrodes as disclosed in Japanese patent publication No. 16312, 1976, and U.S. patent application Ser. No. 706,596 filed on July 19, 1976 by Sakai, for example. The invention described in these applications will be described hereunder with reference to FIGS. 1A and 1B.

FIG. 1A shows the electrode construction of a transistor of the Japanese patent publication wherein an emitter electrode 12a is formed on a peak shaped polycrystalline silicon body 11a whereas FIG. 1B shows the electrode construction of a transistor of the U.S. patent application wherein an emitter electrode 12b is formed on a polycrystalline silicon body of an inverted frustum shape. These transistors having polycrystalline silicon bodies of the peak or inverted frustum shape are characterized in that the polycrystalline silicon bodies are used to form diffused emitter layers 13a and 13b that the width $W_1$ of the upper surface can be made to be larger than the width $W_2$ at the lower end of the polycrystalline silicon body at which it contacts the silicon substrate and that base electrodes 14a and 14b are formed by utilizing the difference in the widths ($W_1 - W_2$). If desired, base contact diffusion can also be made. In FIGS. 1A and 1B, 15a and 15b shown diffused base regions and 16a and 16b diffused collector regions.

With the constructions shown in FIGS. 1A and 1B, the positional relationship between the emitter electrodes 12a and 12b and the base electrodes 14a and 14b of the transistors is determined by the shape (peak and inverted frustum) of the polycrystalline silicon bodies so that the high frequency characteristic of the transistor can be improved.

Where such electrode construction is applied to the gate electrode of a MOS transistor it is possible to assure self-alignment of the source and drain electrodes. Also in the integrated circuit it becomes possible to form, at a high density, inside wirings and resistor elements without using interlead insulating layers.

However, such advantages can be realized in the transistors of the type described above only by shaping the sectional configuration of the polycrystalline silicon body to have accurate peak or inverted frustum shape. Accordingly, it is necessary to etch the polycrystalline silicon bodies to have accurate sectional configuration. In the construction shown in FIG. 1A, when the position of the photoresist pattern, not shown, that determines the position of the polycrystalline silicon body 11a differs slightly from the position of the diffused emitter layer 13a a nonuniform current distribution or a short circuit between the emitter and base electrodes would be resulted thus degrading the characteristics of the transistor. In the construction shown in FIG. 1B, unless the difference between $W_1$ and $W_2$ is made substantial the isolation between the emitter electrode 12b and the base electrode 14b becomes difficult thus causing short circuiting or leakage of the current.

Considering these problems in more detail, the inverted frustum is formed by utilizing the variation in the etching speed which is different depending upon the concentration of the impurities contained in the polycrystalline silicon body. With a chemical etching method it is difficult to independently control the amount of etching in the horizontal and vertical direction. Consequently, if the amount of etching is not sufficient at the inclined side surface of the inverted frustum short circuiting between the emitter and base electrodes would be resulted. On the other hand, if the amount of etching of these portions were too large the area of the emitter electrode would become too small, thus limiting the current capacity. Furthermore, in the constructions shown in FIGS. 1A and 1B it is impossible to make sufficiently large the thickness of the emitter electrode, since if the thickness of the emitter electrode were too large, for example 0.3 micron and more, the spacing between the base and emitter electrodes would become two small thus causing short circuiting. For this reason, with this construction it is impossible to obtain transistors having a large current capacity (that is emitter electrode having a large sectional area).

SUMMARY OF THE INVENTION

Accordingly, it is an object of this invention to provide an improved semiconductor device having stable characteristics and small size and a method of manufacturing the same.

Another object of this invention is to provide a semiconductor device that can be fabricated as a high density integrated circuit and a method of manufacturing the same.

Still another object of this invention is to provide a semiconductor device capable of increasing the current capacity than the prior art construction by increasing the thickness of the electrode metal layer and a method of manufacturing the same.

A further object of this invention is to provide a semiconductor device in the form of a bipolar transistor having excellent high frequency characteristics and a method of manufacturing the same.

Still further object of this invention is to provide a novel method of manufacturing a semiconductor device capable of simplifying the manufacturing steps as a result of exhausts we research on self-aligning technique.

Another object of this invention is to provide a novel method of manufacturing a semiconductor device which does not require any highly precise working.

According to one aspect of this invention there is provided a semiconductor device comprising a semiconductor substrate, a polycrystalline silicon semiconductor body extending upwardly from a portion of the surface of the semiconductor substrate and containing an impurity at a substantially uniform concentration, and a metal electrode disposed on the top surface of the polycrystalline silicon semiconductor body and extending in the lateral direction beyond the periphery of the top surface of the polycrystalline silicon semiconductor body.

According to another aspect of this invention, there is provided a method of manufacturing a semiconductor device comprising the steps of forming a polycrystalline silicon semiconductor body at a predetermined position on the surface of a semiconductor substrate, and plating metal electrode on the top surface of the polycrystalline silicon semiconductor body such that the plated metal electrode extends in the lateral direction beyond the priphery of the top surface of the polycrystalline silicon semiconductor body.

BRIEF DESCRIPTION OF THE DRAWINGS

Further objects and advantages of the invention can be more fully understood from the following detailed description taken in conjunction with the accompanying drawings in which.

DESCRIPTION OF THE PREFERRED EMBODIMENTS

Figure 1A:
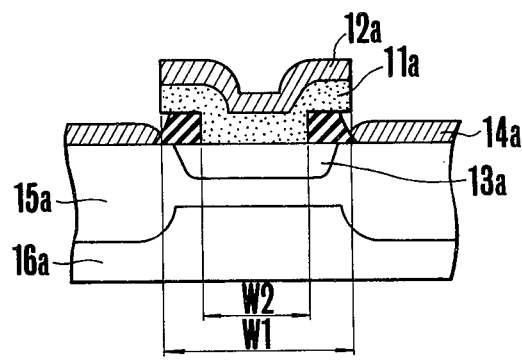
FIGS. 1A and 1B are sectional views showing portions of prior art semiconductor devices of the type wherein one of the electrodes is formed on a polycrystalline silicon body extending upwardly from the semiconductor substrate.
Figure 1B:
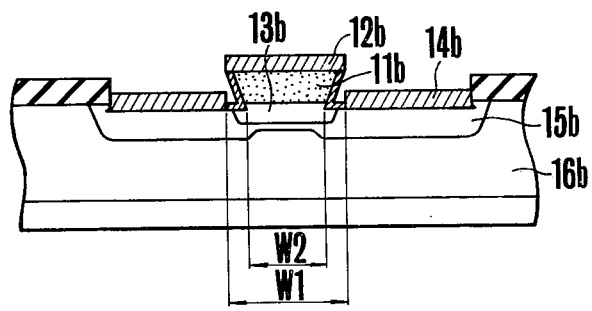
Figure 2:
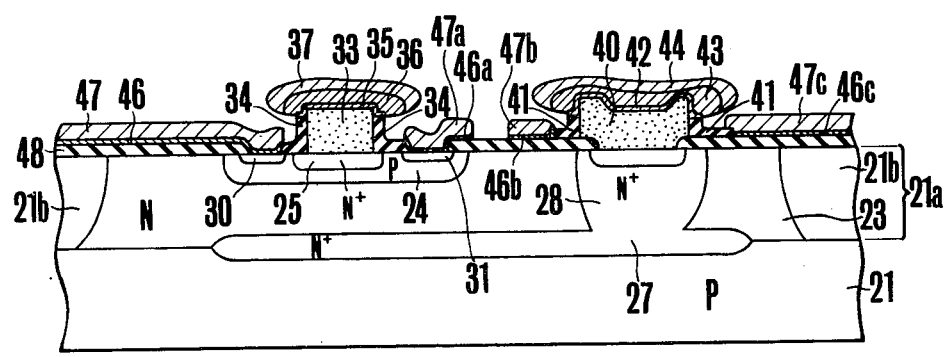
FIG. 2 is a sectional view showing one embodiment of the semiconductor device embodying the invention.

FIG. 2 shows one embodiment of the semiconductor device of this invention, more particularly a NPN type bipolar transistor comprising a P type silicon semiconductor substrate 21 and a N type silicon epitaxial layer 21a formed on one surface of the substrate 21. An isolating layer 21b is formed at a suitable region of the epitaxial layer by diffusing a P type impurity to reach the P type silicon substrate 21 so that a collector region 23 is formed by the portion of the N type silicon epitaxial layer isolated by the isolating layer 21b. A base region 24 is formed by diffusing a P type impurity into a portion of the collector region 23. Furthermore, a N+ emitter region 25 is formed by diffusing a N type impurity into a portion of the base region 24. There are provided a N+ type burried layer 27 and N+ diffused contact region formed in the collector region 23 and electrically connected with the burried layer 27. Reference characters 30 and 31 show P+ contact regions formed in the base region 24. A polycrystalline semiconductor body 33 (for example polycrystalline silicon body) is disposed on the emitter region 25 to extend upwardly. The polycrystalline silicon body 33e has substantially uniform impurity concentration and its sectional configuration at the base in contact with the emitter region 25 and that at the top are substantially the same, that is the vertical section of the polycrystalline silicon body is rectangular. Insulating films, for example SiO₂ films 34, are provided to cover the side surfaces of the polycrystalline silicon body 33, and portions of the emitter region 25 and the base region 24. A prime metal layer 35 is provided on the top surface of the polycrystalline silicon body 33 and an electroplated metal layer 36 is provided to cover the prime metal layer 35. A metal layer 37 is vapor deposited on the plated metal layer 36.

A polycrystalline semiconductor body 40, for example a polycrystalline silicon body, is mounted on the diffused contact region 28 is the collector region 23 to extend upwardly. In the same manner as in the polycrystalline silicon body 33, the periphery of this polycrystalline silicon body 40 is also covered by an insulating film 41 and a prime metal layer 42, a plated metal layer 43 and a vapor deposited metal layer 44 are formed to cover the top surface of the polycrystalline silicon body 40. Prime metal layers 46 and 46a are formed on the base region 30 and the contact region 31 respectively and covered by vapor deposited metal layers 47 and 47a, respectively. Reference characters 46b and 46c represent prime metal layers, 47b and 47c vapor deposited metal layers and 48 an insulating film.

The semiconductor device constructed as above described has the following advantages.

1. Since one of the electrodes of the semiconductor device is formed on a cubic polycrystalline silicon body having a uniform impurity concentration, and since the metal electrode is mounted on the polycrystalline silicon body to laterally extend beyond the periphery thereof it is possible to miniaturize the semiconductor device and to improve the high frequency characteristics thereof just in the same manner as in the semiconductor device provided with peak or inverted frustum shaped electrode. For this reason, the semiconductor device of the invention is suitable to fabricate an integrated circuit.

2. Since the electrode having the construction described above is used as a mask, there is no fear of degrading the characteristics of the transistor due to the misalignment of the photoresist pattern as in the semiconductor device utilizing a peak shaped electrode. Furthermore, with this construction respective electrodes are positively isolated so that such problems as short circuiting of electrodes and leakage of current do not occur as in the prior art semiconductor device utilizing an inverted frustum shaped electrode.

3. With the electrode constructed as above described, there is no factor that limits the thickness of the electrode as in the prior art construction. Accordingly, it is possible to form an electrode having any desired current capacity.

Sequential steps of manufacturing the semiconductor device described above will now be described with reference to FIGS. 3A through 3N.

At first a semiconductor substrate 50 comprising a P type silicon having thickness of about 200 microns and a specific resistance of 5 to 50 ohms is prepared and then arsenic is diffused into one surface of the semiconductor substrate to form a burried layer 51 having a depth of about two microns and a specific resistance of about 5 to 15 ohms. Then, a N type silicon layer having a specific resistance of from 0.2 and 1 ohm is epitaxially grown on the semiconductor substrate 50 to a thickness of 2 to 3 microns. Thereafter, an oxide film (SiO₂) having a thickness of about 0.4 to 0.6 micron is formed. After forming perforations of a predetermined pattern through the oxide film, a P type impurity, for example, is diffused through the perforations to depth of about 3.5 microns and at a concentration of $1 \times 10^{20}/cm^3$ to form isolating regions 52 and 53. Thereafter, an oxide film is formed over the entire area of the N type silicon epitaxially grown layer and the oxide layer is removed according to a predetermined pattern on a portion of the collector region 54 formed by the isolating region 53. Then a N type impurity, arsenic or phosphor, is diffused into the exposed portion to the depth of from 2 to 2.5 microns at a concentration of about $1 \times 10^{20}/cm^3$ to form diffused collector region 55. The oxide film on the other portion of the collector region is removed according to a predetermined pattern and the boron is diffused into the expose portion of the collector region at a concentration of $5 \times 10^{18}$ to $1 \times 10^{19}/cm^3$ to form a base region 56. Then the oxide film on the diffused contact region 55 in the collector region 54 is removed. Reference charactors 57a, 57b and 57c shown remaining portions of the oxide film. Then, a polycrystalline silicon layer 60 having an impurity concentration of about $1 \times 10^{21}/cm^3$ and a thickness of 0.35 micron or more is formed on the oxide layer. Thereafter etchant resistant patterns 61a and 61b are formed at suitable positions on the polycrystalline silicon layer 60. These patterns are not required to have extremely accurate positions as in the prior art semiconductor device. The etchant resistant patterns 61a and 61b can be formed by a photoresist pattern prepared by conventional photoetching technique, or by photoetching a silicon oxide film or a silicon nitride film formed on the polycrystalline film 60 by chemical vapor deposition method.

Figure 3A:
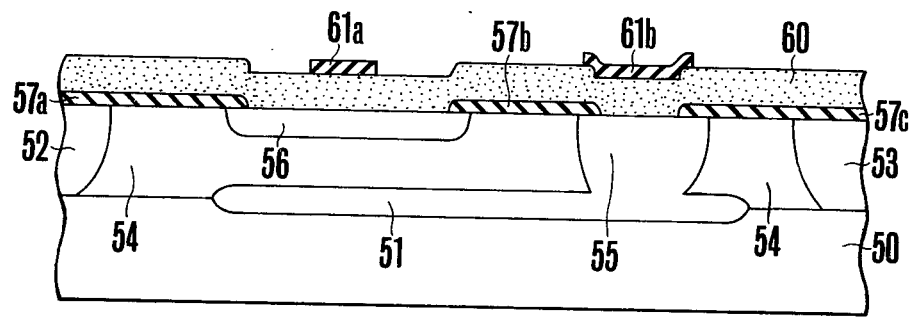
FIGS. 3A through 3N are sectional views showing successive manufacturing steps of the semiconductor device shown in FIG. 2.

Then the polycrystalline silicon layer 60 on the silicon substrate shown in FIG. 3A is etched by utilizing the etchant resistant patterns 61a and 61b to form a polycrystalline silicon portion 60a for forming an emitter electrode and a polycrystalline silicon portion 60b for forming a collector terminal. One example of the method of forming the polycrystalline silicon portions 60a and 60b for forming the emitter electrode and the collector terminal respectively comprises the steps of masking the etchant resistant patterns 61a and 61b and then etching the silicon wafer in an etching solution of the composition HF:HNO₃:H₂O = 1:60:60. Alternatively, the portions 60a and 60b can be formed by plasma etching technique utilizing freon gas.

Figure 3B:
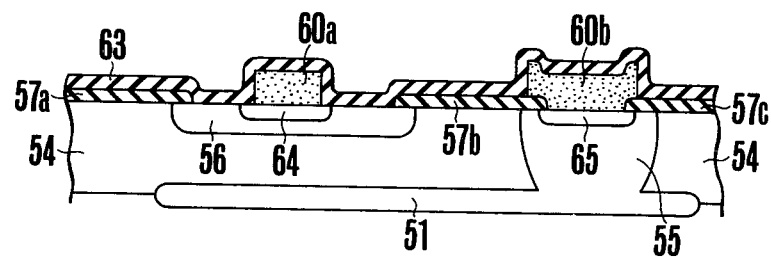

Then, the etchant resistant patterns 61a and 61b are removed and the surface of the silicon wafer is covered by an insulating silicon oxide film 63 as shown in FIG. 3B. Although this silicon oxide film 63 can be formed by heating the silicon wafer in an oxygen atmosphere at a high temperature (1050° C.), it can also be formed by chemical deposition method or by exposing the silicon wafer to a gaseous mixture of hydrofluoric acid and nitrous acid. An oxide film which is formed at the time of forming the emitter layer and the collector contact layer to be described hereunder can be used as the insulating oxide film 63. In this case, the thickness of the oxide film may be of the order of 0.2 to 0.3 micron.

Then, the arsenic doped in the polycrystalline silicon electrode and the collector terminal respectively is caused to diffuse into the base layer 56 and the diffused collector contact region 55 to form an emitter layer 64 and a contact layer 65 by heat treating the silicon wafer at a temperature of 1000° C. for 7 minutes. When the depth of the emitter junction $X_j$ is selected to be 0.1 micron, the diffusion occurs uniformly also in the lateral direction so that the width of the emitter layer 64 becomes wider by 0.2 micron than the width of the portion 60a of the polycrystalline silicon body which is used to form the emitter and is in contact with the base layer 56. At the same time, the collector contact layer 65 which is wider than the portion 60b of the polycrystalline silicon for forming the collector terminal by 0.2 micron is formed in the diffused collector contact region 55. FIG. 3B shows this condition, in which only portions relating to subsequent steps are shown.

Figure 3C:
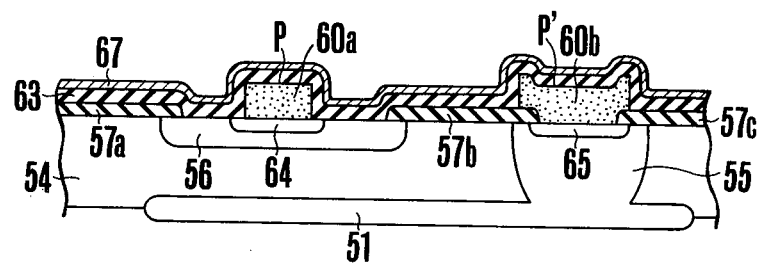

Then a metal film 67 acting as a prime film for plating is applied to cover the entire surface of the insulating silicon oxide film 63 of the silicon wafer in the condition shown in FIG. 3B. This prime metal film 67 can be formed by vapor depositing such metals as nickel, molybdenum, platinum and gold and has a thickness of about 0.1 micron. FIG. 3C shows this condition.

Figure 3D:
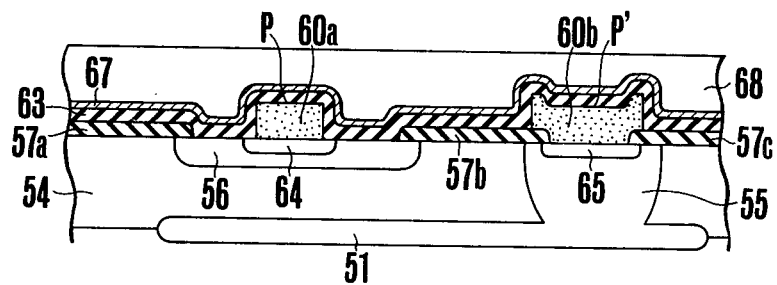

Then, a relatively thick photoresist film 68 (positive type) having a thickness of about 1.5 micron is applied on the portions 60a and 60b to cover the insulating silicon oxide film 63 and the prime metal film 67 on surface P of the portion 60a of the polycrystalline silicon for forming the emitter electrode, and the upper surface P' of the portion 60b of the polycrystalline silicon for forming the collector terminal as shown in FIG. 3D. This photoresist film 68 can be formed by applying AZ-1350H sold by Shiplay Co. with a conventional film forming device (usually called "spinner") in the following manner. More particularly after mounting the silicon wafer on the spinner, liquid photoresist is dropped in a quantity sufficient to wet the surface of the silicon wafer. Then, the silicon wafer is rotated to remove excess liquid photoresist except a definite quantity remaining on the silicon wafer. The rotation of the silicon wafer is stopped before the photoresist dries, that is while it is still flowable, and the liquid photoresist is dried while the silicon wafer is maintained at the horizontal position. The relationship between the spinning speed and the thickness is disclosed in "Proceedings of the 1970 Kodak Seminar on microminiaturization" page 68, FIG. 25, published by Eastman Kodak Co.

Figure 3E:
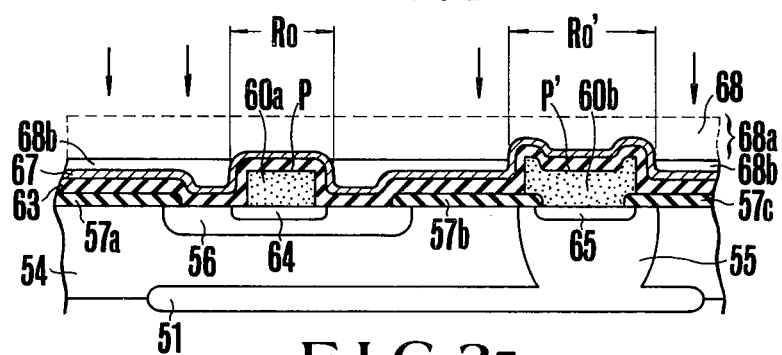

Then, ultraviolet rays having an uniform intensity is irradiated form above over the entire surface of the silicon wafer in a state shown in FIG. 3D, without using a photomask, as shown in FIG. 3E. Then, the irradiated silicon wafer is developed to remove a portion 68a of the photoresist film 68 to expose a portion $R_0$ of the prime metal film 67 overlying the top surface P of the polycrystalline silicon for forming the emitter electrode. Thus, the portion $R_0$ of the prime metal film protrudes through the remaining portion 68b of the photoresist film. At the same time, a portion $R_0'$ of the prime metal film on the top P' of the portion 60b of the polycrystalline silicon for forming the collector terminal is also exposed. To remove the portion of the photoresist film up to the top surfaces P and P' of the portions 60a and 60b of the polycrystalline silicon by exposing to light the relatively thick photoresist film 68 it is necessary to control the amount of exposure and the condition of development. Where the thickness of the photoresist is equal to 1.5 microns, the amount of exposure is limited to about 80% of the standard exposure and a development temperature lower than room temperature is used to obtain better results. Where a 200 W mercury lamp is used, the lamp is spaced about 40 cm from the silicon wafer and a developing liquid suitable for AZ-1350OH photoresist is diluted for a concentration of ½ of the normal and the development is performed for 15 to 30 seconds at a temperature of 10° C. Under these circumstances, it is possible to reduce the thickness of the photoresist film to a thickness of about 1.5 microns while watching the etching operation.

Figure 3F:
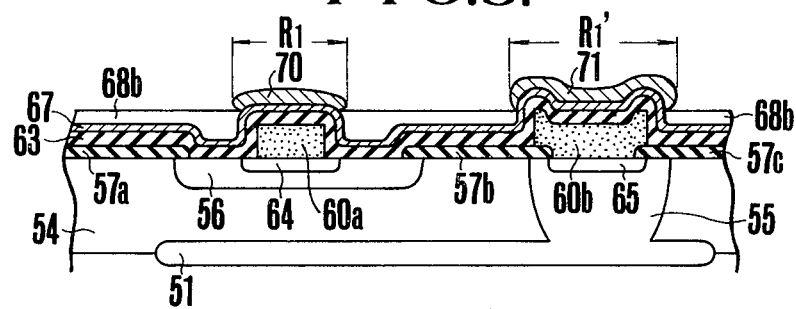

Then under the condition shown in FIG. 3E, the prime metal film exposed through the remaining photoresist film 68b is plated with a metal film by applying a plating potential to the prime metal film 67. By this electroplating mask patterns 70 and 71 are formed having widths $R_1$ and $R_1'$ respectively which are wider than the bottom surfaces of the polycrystalline silicon semiconductor tbodies 60a and 60b as shown in FIG. 3F. A case wherein the mask patterns 70 and 71 are made of gold will be described in the following.

Electrolyte: Temperex 401 (a trade name of Kabushiki Kaisha Nippon Electroplating Engineers)

Plating conditions: current 8 mA/cm$^2$, 150 sec.

When plating is performed under the conditions described above, the thickness of the plated gold film increases while at the same time as the gold ions uniformly deposit in the lateral direction, the widths $R_1$ and $R_1'$ of the plating films increase with the increase in the thickness. When a gold film having a thickness of one micron is plated the width thereof becomes 2 microns with the result that the sectional configuration of a combination of the mask pattern 70 and the underlying portion 60a of the polycrystalline silicon for forming the emitter electrode will have a shape of the head of a nail. In the same manner, the combination of the mask pattern 71 and the underlying portion 60b of the polycrystalline silicon for forming the collector terminal also takes the form of the head of a nail. Such phenomena of lateral extension of the mask patterns are described in an article "Metal Does not Deposit Uniformly with Respect to Thickness on All Surfaces" an pages 59-63, of Electroplating Engineering Handbook published in the year of 1955 by Book division Reinhold Publishing Corporation.

Then the photoresist film 68b remaining on the silicon wafer as shown in FIG. 3F is irradiated from above with uniform ultraviolet rays. After development the portions of the photoresist film other than the portions 68c-68f thereof underlying the mask patterns and not exposed to the ultraviolet rays, and the prime metal film are removed by etching, thus preserving metal films 67a and 67b. Such etching can also be performed by plasma etching technique. Then, boron is implanted at a high concentration into the base layer 56 to form base contacts 73 and 74. The implanted boron readily transmits through the insulating silicon oxide film 63 but not through silicon oxide films 57a through 57c which are formed by a thermal treatment. This condition is shown in FIG. 3G.

This process step is characterized in that the base contact, an important element of transistor, is easily and accurately positioned by utilizing the nail head shaped portions underlying the mask patterns 70 and 71. Thus, for example, at the time of forming the emitter layer 64 and the base contacts 73 and 74, the amount of the the impurity that moves in the lateral direction through the base layer does not exceed the amount of the impurity ($X_j$) that moves in the thickness direction. Consequently, when $X_j=0.1$ micron, the sum of the thickness of the silicon oxide film and the prime metal film is equal to 0.3 micron and the width W of the portion underlying the mask pattern is equal to 0.4 micron, whereby a small spacing W' of 0.6 micron can be assured between the emitter layer 64 and the base contacts 73 and 74 by self-alignment without using any photomask.

This means that the spacing W' between the emitter layer and the base contacts is constant regardless of the fact that the dimensions of the etchant resistant patterns 61a and 61b formed by transfer printing of a conventional photomask differ in a wafer or among different wafer.

Figure 3G:
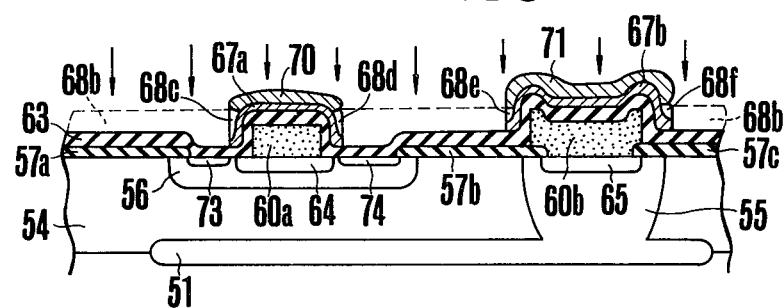

After forming the base contacts 73 and 74 as shown in FIG. 3G, the overlying insulating silicon oxide film 63 is removed by etching which is performed by dipping the silicon wafer in a hydrofluoric acid buffer solution. Thus, the portions of the insulating silicon oxide film 63 adjacent the base layer 56 and protected by the overlying photoresist films 68c through 68f and mask patterns 70 and 71 are not etched off. However, other portions of the oxide film 63 are etched off. Accordingly, when the silicon wafer is taken out of the hydrofluoric acid buffer solution after completion of the etching step, the surfaces of the base contacts 73 and 74 are exposed.

Then the remaining photoresist films 68c through 68f, the mask patterns 70 and 71 and underlying prime metal films 67a and 67b are removed by a chemical technique. Thereafter, the wafer is heat-treated to form stable base contacts 73 and 74.

Where the base contacts are formed by a vapor phase diffusion process utilizing a BN (boron nitride) plate instead of the ion implantation process, the portion of the insulating silicon oxide film 63 not covered by the remaining photoresist films 68c through 68f and by mask patterns 70 and 71 is removed by such suitable method as chemical etching or sputtering etching to expose a portion of the base layer 56, and an impurity is diffused into the exposed portion by vapor phase diffusion. For example, treatment at 900° C. for 10 minutes gives a P++ base contact having a thickness of 0.1 micron and having a width in the lateral direction. Of course, the vapor phase diffusion treatment should be made after removing the remaining photoresist films 68c through 68f, mask patterns 70 and 71 and the prime metal film 67.

Figure 3H:
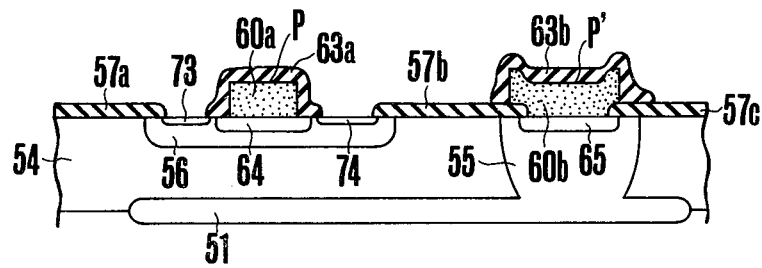

FIG. 3H shows the silicon wafer under these conditions. As shown, the portions of the silicon wafer other than the base contacts 73 and 74 are covered by silicon oxide films 57a–57c and insulating silicon oxide films 63a and 63b.

Then, the silicon oxide films 63a and 63b overlying the portions 60a of the polycrystalline silicon for forming the emitter electrode and the portion 60b of the polycrystalline silicon for forming the collector terminal are removed by for example exposing a portion to be etched off later through a photoresist film 76 formed by forming a relatively thick photoresist film and then exposing the entire area thereof to light and then removing the exposed portion by a suitable method. This condition is shown in FIG. 3I.

Figure 3I:
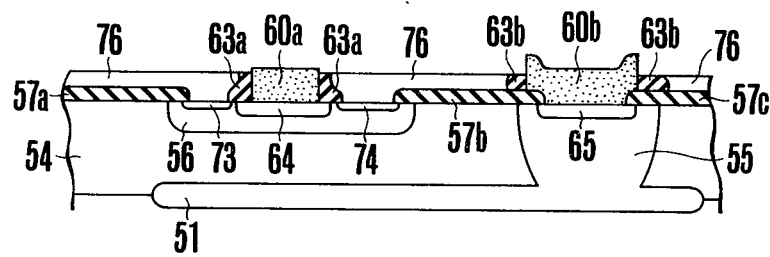

Then, the photoresist film 76 shown in FIG. 3I is removed by etching. After washing the surface with a dilute hydrofluoric acid solution, a wiring metal film 77 is applied over the entire surface of the silicon wafer. The metal film 77 is formed directly on the base contacts 73 and 74 and the upper and side surfaces of the polycrystalline silicon bodies 60a and 60b. In other portion, the metal film 77 is formed on the oxide films 57a through 57c, 63a and 63b.

There is no limit on the type of the wiring metal film 77. A single metal film or a composite metal film may be used so long as it can be plated electrically. In the illustrated example, nickel was deposited to a thickness of 0.1 micron by vapor deposition technique.

Figure 3J:
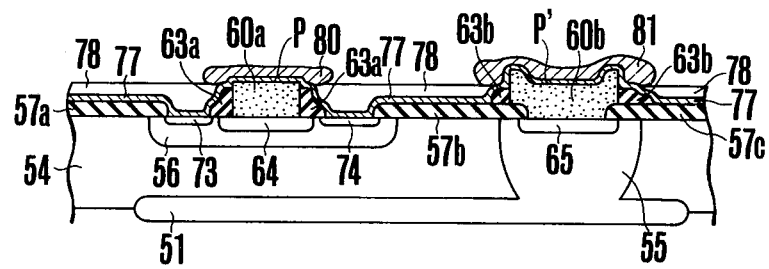

Then, the silicon wafer is heat-treated for the purpose of providing ohmic connections to the upper surfaces P and P' of the portions 60a and 60b of the polycrystalline silicon bodies. Then, a relatively thick photoresist film is formed on the surface of the silicon wafer by the same process steps described in connection with FIG. 3D. Then, by the total exposure and the development treatments, the portions of the wiring metal film 77 overlying the polycrystalline silicon bodies 60a and 60b are exposed through the photoresist film 78 thereby forming an emitter electrode 80 and a collector electrode 81 by the plating step similar to that used for preparing the mask patterns 70 and 70' shown in FIG. 3F. This condition is shown in FIG. 3J. As shown, the electrodes 80 and 81 form nail head shape when combined with the polycrystalline silicon bodies 60a and 60b in the same manner as the mask patterns 70 and 71 shown in FIG. 3F.

Then, the surface of the silicon wafer in the condition shown in FIG. 3J is subjected to uniform exposure and development to preserve remaining photoresist films 78a through 78d beneath the emitter electrode 80 and the collector electrode 81. Then, a plating potential is applied to the wiring metal film 77 to plate metal on the wiring metal film 77 and the electrodes 80 and 81 except the portions protected by the remaining photoresist films 78a through 78d, thus forming an emitter conductor metal film 83, a collector conductor metal film 84 base conductor metal films 85, 86 and inner wiring conductor metal film 87 respectively on the emitter electrode 80, collector electrode 81 and wiring metal film 77 under the same conditions described with reference to FIG. 3F and used for preparing the mask patterns. The thickness of the photoresist films 78a and 78b underlying the nail head shaped emitter electrode 80 is immaterial to the determination of the relative position between the emitter layer 64 and base contacts 73 and 74 which has been described in connection with FIG. 3G. In other words, the purpose of the remaining photoresist films 78a and 78b is to prevent electrical contact between the emitter conductor metal film 83 on the emitter electrode 80, the collector conductor metal film 84 and the base conductor metal films 85 and 86 and to prevent the collector conductor metal film 84 from contacting the base conductor metal films 85 and 86 and the inner wiring conductor metal film 87. As a consequence, the electrodes formed on the polycrystalline silicon bodies 60a and 60b are made of metal so that they have a large current capacity, thus improving the characteristics of the transistor. If desired, these metal films may be formed by vapor deposition technique instead of electroplating.

Figure 3K:
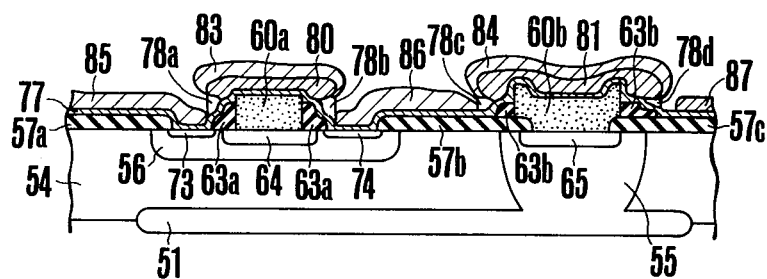
Figure 3L:
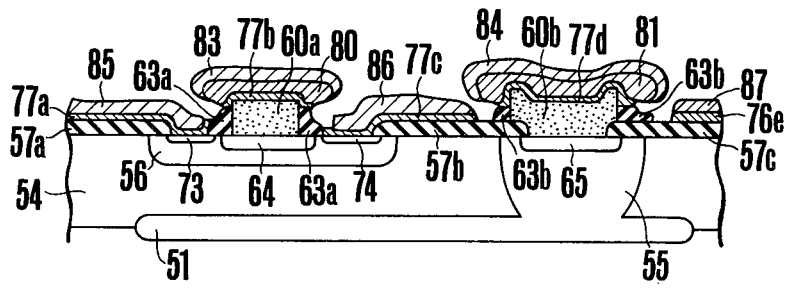
Figure 3M:
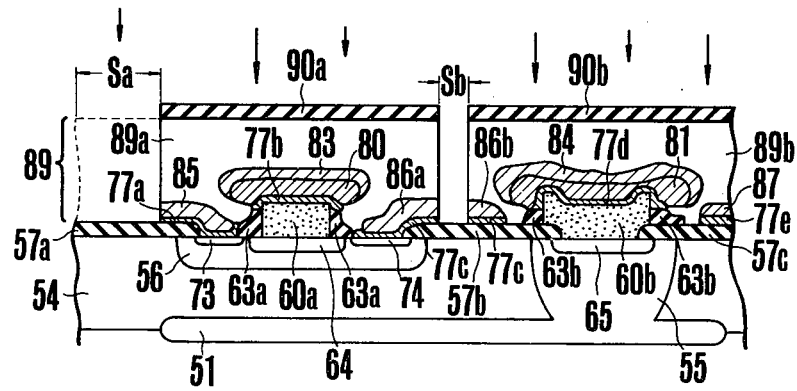

Then, the remaining photoresist films 78a through 78d on the silicon wafer are removed in the condition shown in FIG. 3K, and then the exposed wiring metal film 77 is removed by using Resist Strip J-100 sold by Indust Richen Laboratory Corporation, or hydrochloric acid for dividing the film 77 into sections 77a through 77c. As a consequence, the collector conductor metal film 84, the base conductor metal film 86 and inner wiring conductor metal film 87 which have been interconnected through the metal film 77 will be isolated from each other. This condition is shown in FIG. 3L. Then, a photoresist film 89 made of AZ-1350H and having a thickness sufficient to cover the emitter conductor metal film 83 and the collector conductor metal film 84 is formed and separating photomasks designated by 90a and 90b are superposed on the photoresist mask 89 and the assembly is exposed to light as shown by arrows in FIG. 3M and the portions Sa and Sb of the photoresist film are removed by development. Then, the exposed base conductor metal films 85 and 86 and underlying wiring metal films 77a and 77c are removed with the result that the base conductor metal film 86 is divided into two sections 86a and 86b, the latter serving as the collector conductor metal film. If necessary, the wiring metal film about the collector conductor metal film and two layers of the inner wiring conductor metal film which are not necessary to constitute a transistor are also removed. FIG. 3M shows this condition. The application of the relatively thick photoresist film, exposure and development thereof can be made by the same method as above described. The accuracy of aligning the positions of the silicon wafer and the photomask for exposing unnecessary areas of the conductor metal is not necessary to be accurate. The two layers of the metal at unnecessary area can be removed by agua regia at a temperature of 40° C.

Then, under the condition shown in FIG. 3M, the thick photoresist films 89a and 89b on the surface of the silicon wafer are removed to complete the transistor of this invention. FIG. 3N is a perspective view, partly in section, of the completed transistor. As shown, since the emitter electrode 80 is covered by the emitter conductor metal film 83, the overall thickness is larger than that of the prior art construction. In the same manner, since the collector electrode 81 is covered by the collector conductor metal film 84, its thickness is larger than that of the prior art. Element 86a is used as the base electrode whereas element 91 as the inner wiring conductor.

Figure 4A:
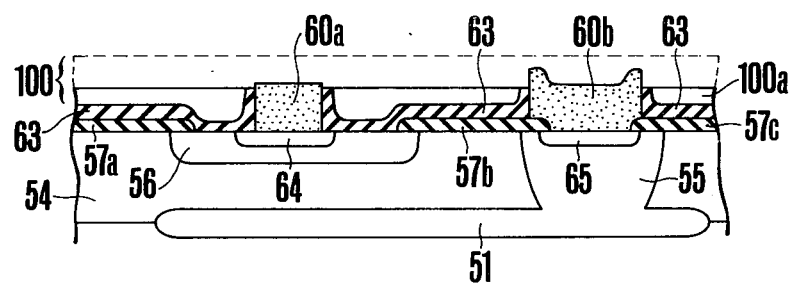
FIGS. 4A through 4D are sectional views corresponding to FIGS. 3A through 3N and showing successive steps of manufacturing a modified semiconductor device of this invention.

FIGS. 4A through 4D show successive steps of a modified method of this invention. In this modification, up to FIG. 3B the same process steps are used. After completing the step shown in FIG. 3B, the surface of the silicon wafer is covered by a thick photoresist film 100 comprising AZ-1350H by using the spinner described above. Then, in the same manner as above described with reference to FIG. 3D, the surface of the silicon wafer is uniformly irradiated with ultraviolet rays and then the photoresist film 100 is developed to remove a portion thereof. Then, the upper surfaces of the polycrystalline silicon bodies 60a and 60b for forming the emitter electrode and the collector terminal respectively will expose through the remaining portion 100a of the photoresist film 100. Then, the portions of the insulating silicon oxide film overlying the polycrystalline silicon bodies 60a and 60b are removed by etching. FIG. 4A shows this condition.

Figure 4B:
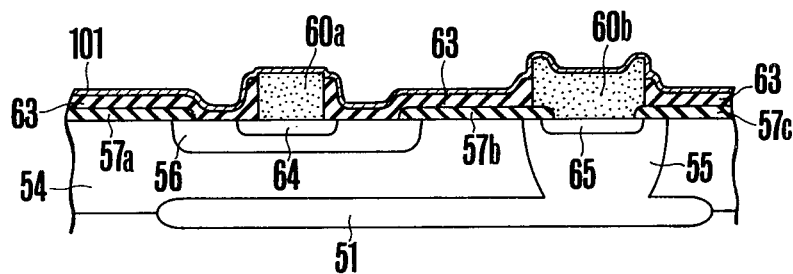

After removing the photoresist film 100a, a prime metal film 101 for plating and comprising nickel or molybdenum is formed on the entire surface of the silicon wafer by vacuum vapor deposition for example to a thickness of about 0.1 micron. FIG. 4B shows this condition.

Figure 4C:
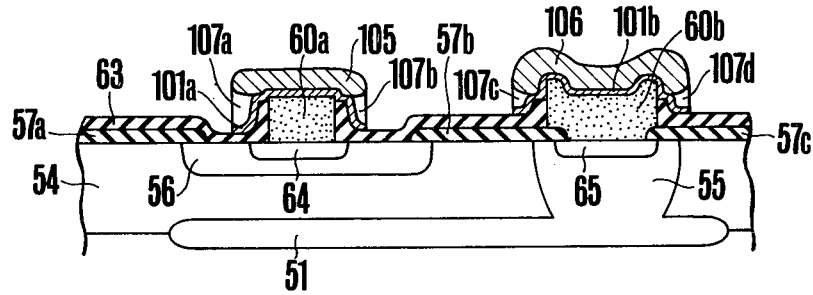

Then, mask patterns 105 and 106 are formed on the polycrystalline silicon bodies 60a and 60b by the same process steps as shown in FIGS. 3F and 3G. More particularly, the entire surface of the silicon wafer is again covered by a photoresist film, and the top surfaces of the polycrystalline silicon bodies 60a and 60b are exposed. Then, mask patterns 105 and 106 are formed on the exposed top surfaces by electroplating. Then, the entire surface of the silicon wafer is irradiated with ultraviolet rays by using the mask patterns 105 and 106 as masks. Then, development and etching are made to remove the plated metal film 101 except the portions 101a and 101b there of underlying the portions 107a through 107d of the photoresist film and the mask patterns 105 and 106. FIG. 4C shows this condition.

Then, base contacts 108 and 109 are formed by the same process steps as shown in FIG. 3G. More particularly, boron is implanted into the silicon wafer shown in FIG. 4C by using an energy that causes boron to transmit through the insulating silicon oxide film 63 but not through the silicon oxide film 57a which is formed by heat treatment thus forming base contacts 108 and 109. Then, the portions 107a through 107d and the portions 101a and 101b of the prime metal films underlying the mask patterns 105 and 106 are removed and the unnecessary portion of the insulating silicon oxide film 63 is removed. Then, wiring metal films 110a through 110e are formed by vapor deposition, for example. FIG. 4D shows this condition showing that the same construction as that shown in FIG. 3L can be obtained. Although diffusion of the base contact is optional, ion implantation requires high temperature treatment so that it is advantageous to use such metal as molybdenum which does not diffuse deeply into the polycrystalline silicon bodies 60a and 60b when subjected to high temperature treatment as to form the plating prime metal films 101a and 101b and the mask pattern metal films 105 and 106. Where base contact diffusion is not necessary, any metal can be used for the metal films 101a, 101b, 105 and 106. Subsequent process step is the same as the step shown in FIG. 3M, and finally a transistor shown in FIG. 3N can be obtained.

Comparing with each other the embodiments shown in FIG. 3 and FIG. 6 it will be clear that the latter embodiment requires smaller number of steps. This is true especially when the base contact diffusion is not necessary.

In the embodiment shown in FIG. 3, since the purpose of the process step shown in FIG. 3M is to remove metals at unnecessary portions, this step may be performed in other step by a well known method. For example, when removing the photoresist in the step shown in FIG. 3I, it is possible to vapour deposit the prime metal film 26 while preserving a thin photoresist layer at a portion where the metal film is to be removed in a later step, then proceed to the step shown in FIG. 3K through the step shown in FIG. 3J and finally remove unnecessary metal film 86 and the wiring prime metal film 77c together with the photoresist film by dipping the silicon wafer in a photoresist removing liquid.

Figure 5A:
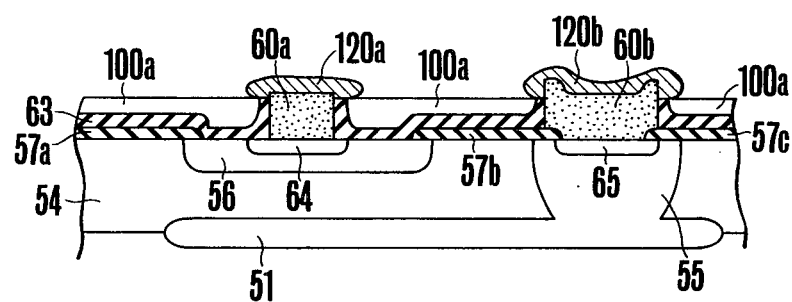
FIGS. 5A and 5B are sectional views showing various steps of manufacturing another modification of the semiconductor device of this invention.
Figure 5B:
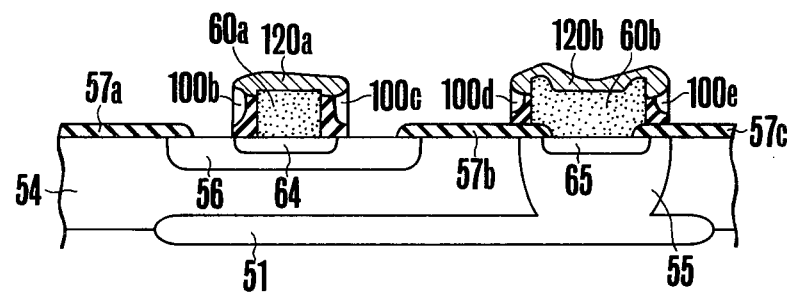

FIGS. 5A and 5B shown still another embodiment of this invention in which the mask patterns are formed by electrodeless plating.

When the process steps up to FIG. 4A have been performed, metal films are applied onto the polycrystalline silicon bodies 60a and 60b to form mask pattern metal films 120a and 120b on the polycrystalline silicon bodies as shown in FIG. 5A. Thereafter, the entire surface of the silicon wafer is irradiated with ultraviolet rays by using these mask pattern metal films as a mask and the wafer is then developed. Then, the wafer is subjected to a chemical etching to remove the insulating silicon oxide film except the portion thereof convered by the portions 100b through 100e of the photoresist film underlying the mask pattern metal films 120a and 120b. FIG. 5B shows the state of this time.

73 and 74 by self-alignment without using any photomask.

This means that the spacing W' between the emitter layer and the base contacts is constant regardless of the fact that the dimensions of the etchant resistant patterns 61a and 61b formed by transfer printing of a conventional photomask differ in a wafer or among different wafer.

After forming the base contacts 73 and 74 as shown in FIG. 3G, the overlying insulating silicon oxide film 63 is removed by etching which is performed by dipping the silicon wafer in a hydrofluoric acid buffer solution. Thus, the portions of the insulating silicon oxide film 63 adjacent the base layer 56 and protected by the overlying photoresist films 68c through 68f and mask patterns 70 and 71 are not etched off. However, other portions of the oxide film 63 are etched off. Accordingly, when the silicon wafer is taken out of the hydrofluoric acid buffer solution after completion of the etching step, the surfaces of the base contacts 73 and 74 are exposed.

Then the remaining photoresist films 68c through 68f, the mask patterns 70 and 71 and underlying prime metal films 67a and 67b are removed by a chemical technique. Thereafter, the wafer is heat-treated to form stable base contacts 73 and 74.

Where the base contacts are formed by a vapor phase diffusion process utilizing a BN (boron nitride) plate instead of the ion implantation process, the portion of the insulating silicon oxide film 63 not covered by the remaining photoresist films 68c through 68f and by mask patterns 70 and 71 is removed by such suitable method as chemical etching or sputtering etching to expose a portion of the base layer 56, and an impurity is diffused into the exposed portion by vapor phase diffusion. For example, treatment at 900° C. for 10 minutes gives a P++ base contact having a thickness of 0.1 micron and having a width in the lateral direction. Of course, the vapor phase diffusion treatment should be made after removing the remaining photoresist films 68c through 68f, mask patterns 70 and 71 and the prime metal film 67.

FIG. 3H shows the silicon wafer under these conditions. As shown, the portions of the silicon wafer other than the base contacts 73 and 74 are covered by silicon oxide films 57a–57c and insulating silicon oxide films 63a and 63b.

Then, the silicon oxide films 63a and 63b overlying the portions 60a of the polycrystalline silicon for forming the emitter electrode and the portion 60b of the polycrystalline silicon for forming the collector terminal are removed by for example exposing a portion to be etched off later through a photoresist film 76 formed by forming a relatively thick photoresist film and then exposing the entire area thereof to light and then removing the exposed portion by a suitable method. This condition is shown in FIG. 3I.

Then, the photoresist film 76 shown in FIG. 3I is removed by etching. After washing the surface with a dilute hydrofluoric acid solution, a wiring metal film 77 is applied over the entire surface of the silicon wafer. The metal film 77 is formed directly on the base contacts 73 and 74 and the upper and side surfaces of the polycrystalline silicon bodies 60a and 60b. In other portion, the metal film 77 is formed on the oxide films 57a through 57c, 63a and 63b.

There is no limit on the type of the wiring metal film 77. A single metal film or a composite metal film may be used so long as it can be plated electrically. In the illustrated example, nickel was deposited to a thickness of 0.1 micron by vapor deposition technique.

Then, the silicon wafer is heat-treated for the purpose of providing ohmic connections to the upper surfaces P and P' of the portions 60a and 60b of the polycrystalline silicon bodies. Then, a relatively thick photoresist film is formed on the surface of the silicon wafer by the same process steps described in connection with FIG. 3D. Then, by the total exposure and the development treatments, the portions of the wiring metal film 77 overlying the polycrystalline silicon bodies 60a and 60b are exposed through the photoresist film 78 thereby forming an emitter electrode 80 and a collector electrode 81 by the plating step similar to that used for preparing the mask patterns 70 and 70' shown in FIG. 3F. This condition is shown in FIG. 3J. As shown, the electrodes 80 and 81 form nail head shape when combined with the polycrystalline silicon bodies 60a and 60b in the same manner as the mask patterns 70 and 71 shown in FIG. 3F.

Then, the surface of the silicon wafer in the condition shown in FIG. 3J is subjected to uniform exposure and development to preserve remaining photoresist films 78a through 78d beneath the emitter electrode 80 and the collector electrode 81. Then, a plating potential is applied to the wiring metal film 77 to plate metal on the wiring metal film 77 and the electrodes 80 and 81 except the portions protected by the remaining photoresist films 78a through 78d, thus forming an emitter conductor metal film 83, a collector conductor metal film 84 base conductor metal films 85, 86 and inner wiring conductor metal film 87 respectively on the emitter electrode 80, collector electrode 81 and wiring metal film 77 under the same conditions described with reference to FIG. 3F and used for preparing the mask patterns. The thickness of the photoresist films 78a and 78b underlying the nail head shaped emitter electrode 80 is immaterial to the determination of the relative position between the emitter layer 64 and base contacts 73 and 74 which has been described in connection with FIG. 3G. In other words, the purpose of the remaining photoresist films 78a and 78b is to prevent electrical contact between the emitter conductor metal film 83 on the emitter electrode 80, the collector conductor metal film 84 and the base conductor metal films 85 and 86 and to prevent the collector conductor metal film 84 from contacting the base conductor metal films 85 and 86 and the inner wiring conductor metal film 87. As a consequence, the electrodes formed on the polycrystalline silicon bodies 60a and 60b are made of metal so that they have a large current capacity, thus improving the characteristics of the transistor. If desired, these metal films may be formed by vapor deposition technique instead of electroplating.

Then, the remaining photoresist films 78a through 78d on the silicon wafer are removed in the condition shown in FIG. 3K, and then the exposed wiring metal film 77 is removed by using Resist Strip J-100 sold by Indust Richen Laboratory Corporation, or hydrochloric acid for dividing the film 77 into sections 77a through 77c. As a consequence, the collector conductor metal film 84, the base conductor metal film 86 and inner wiring conductor metal film 87 which have been interconnected through the metal film 77 will be isolated from each other. This condition is shown in FIG. 3L. Then, a photoresist film 89 made of AZ-1350H and having a thickness sufficient to cover the emitter conductor metal film 83 and the collector conductor metal film 84 is formed and separating photomasks designated by 90a and 90b are superposed on the photoresist mask 89 and the assembly is exposed to light as shown by arrows in FIG. 3M and the portions Sa and Sb of the photoresist film are removed by development. Then, the exposed base conductor metal films 85 and 86 and underlying wiring metal films 77a and 77c are removed with the result that the base conductor metal film 86 is divided into two sections 86a and 86b, the latter serving as the collector conductor metal film. If necessary, the wiring metal film about the collector conductor metal film and two layers of the inner wiring conductor metal film which are not necessary to constitute a transistor are also removed. FIG. 3M shows this condition. The application of the relatively thick photoresist film, exposure and development thereof can be made by the same method as above described. The accuracy of aligning the positions of the silicon wafer and the photomask for exposing unnecessary areas of the conductor metal is not necessary to be accurate. The two layers of the metal at unnecessary area can be removed by agua regia at a temperature of 40° C.

Then, under the condition shown in FIG. 3M, the thick photoresist films 89a and 89b on the surface of the silicon wafer are removed to complete the transistor of this invention. FIG. 3N is a perspective view, partly in section, of the completed transistor. As shown, since the emitter electrode 80 is covered by the emitter conductor metal film 83, the overall thickness is larger than that of the prior art construction. In the same manner, since the collector electrode 81 is covered by the collector conductor metal film 84, its thickness is larger than that of the prior art. Element 86a is used as the base electrode whereas element 91 as the inner wiring conductor.

FIGS. 4A through 4D show successive steps of a modified method of this invention. In this modification, up to FIG. 3B the same process steps are used. After completing the step shown in FIG. 3B, the surface of the silicon wafer is covered by a thick photoresist film 100 comprising AZ-1350H by using the spinner described above. Then, in the same manner as above described with reference to FIG. 3D, the surface of the silicon wafer is uniformly irradiated with ultraviolet rays and then the photoresist film 100 is developed to remove a portion thereof. Then, the upper surfaces of the polycrystalline silicon bodies 60a and 60b for forming the emitter electrode and the collector terminal respectively will expose through the remaining portion 100a of the photoresist film 100. Then, the portions of the insulating silicon oxide film overlying the polycrystalline silicon bodies 60a and 60b are removed by etching. FIG. 4A shows this condition.

After removing the photoresist film 100a, a prime metal film 101 for plating and comprising nickel or molybdenum is formed on the entire surface of the silicon wafer by vacuum vapor deposition for example to a thickness of about 0.1 micron. FIG. 4B shows this condition.

Then, mask patterns 105 and 106 are formed on the polycrystalline silicon bodies 60a and 60b by the same process steps as shown in FIGS. 3F and 3G. More particularly, the entire surface of the silicon wafer is again covered by a photoresist film, and the top surfaces of the polycrystalline silicon bodies 60a and 60b are exposed. Then, mask patterns 105 and 106 are formed on the exposed top surfaces by electroplating. Then, the entire surface of the silicon wafer is irradiated with ultraviolet rays by using the mask patterns 105 and 106 as masks. Then, development and etching are made to remove the plated metal film 101 except the portions 101a and 101b there of underlying the portions 107a through 107d of the photoresist film and the mask patterns 105 and 106. FIG. 4C shows this condition.

Then, base contacts 108 and 109 are formed by the same process steps as shown in FIG. 3G. More particularly, boron is implanted into the silicon wafer shown in FIG. 4C by using an energy that causes boron to transmit through the insulating silicon oxide film 63 but not through the silicon oxide film 57a which is formed by heat treatment thus forming base contacts 108 and 109. Then, the portions 107a through 107d and the portions 101a and 101b of the prime metal films underlying the mask patterns 105 and 106 are removed and the unnecessary portion of the insulating silicon oxide film 63 is removed. Then, wiring metal films 110a through 110e are formed by vapor deposition, for example. FIG. 4D shows this condition showing that the same construction as that shown in FIG. 3L can be obtained. Although diffusion of the base contact is optional, ion implantation requires high temperature treatment so that it is advantageous to use such metal as molybdenum which does not diffuse deeply into the polycrystalline silicon bodies 60a and 60b when subjected to high temperature treatment as to form the plating prime metal films 101a and 101b and the mask pattern metal films 105 and 106. Where base contact diffusion is not necessary, any metal can be used for the metal films 101a, 101b, 105 and 106. Subsequent process step is the same as the step shown in FIG. 3M, and finally a transistor shown in FIG. 3N can be obtained.

Comparing with each other the embodiments shown in FIG. 3 and FIG. 6 it will be clear that the latter embodiment requires smaller number of steps. This is true especially when the base contact diffusion is not necessary.

In the embodiment shown in FIG. 3, since the purpose of the process step shown in FIG. 3M is to remove metals at unnecessary portions, this step may be performed in other step by a well known method. For example, when removing the photoresist in the step shown in FIG. 3I, it is possible to vapour deposit the prime metal film 26 while preserving a thin photoresist layer at a portion where the metal film is to be removed in a later step, then proceed to the step shown in FIG. 3K through the step shown in FIG. 3J and finally remove unnecessary metal film 86 and the wiring prime metal film 77c together with the photoresist film by dipping the silicon wafer in a photoresist removing liquid.

FIGS. 5A and 5B shown still another embodiment of this invention in which the mask patterns are formed by electrodeless plating.

When the process steps up to FIG. 4A have been performed, metal films are applied onto the polycrystalline silicon bodies 60a and 60b to form mask pattern metal films 120a and 120b on the polycrystalline silicon bodies as shown in FIG. 5A. Thereafter, the entire surface of the silicon wafer is irradiated with ultraviolet rays by using these mask pattern metal films as a mask and the wafer is then developed. Then, the wafer is subjected to a chemical etching to remove the insulating silicon oxide film except the portion thereof convered by the portions 100b through 100e of the photoresist film underlying the mask pattern metal films 120a and 120b. FIG. 5B shows the state of this time.

Subsequent step is the same as that shown in FIG. 4b.

Where a base contact containing an impurity at a high concentration is to be formed by an boron ion implantation process, the implantation energy is adjusted to a low level not to cause the boron ions to transmit through the oxide film so that the ions are implantation directly into a predetermined depth (for example, 0.05 micron) in the base region. Where, it is desired to efficiently perform the electrodeless plating on the top surfaces of the polycrystalline silicon bodies 60a and 60b, the etchant resistant patterns 61a and 61b are formed after growing the polycrystalline silicon bodies shown in FIG. 3A and then vapor depositing thin metal films thereon. With these treatments, the electrodeless plating film is applied on to the thin metal film so that the efficiency of the plating can be improved. Additionally, it may be desirable prior to the electrodeless plating to slightly etch the surface of the thin metal films exposed on the top surfaces of the polycrystalline silicon bodies 60a and 60b to eliminate any oxide which may have formed on the thin film. When the mask pattern metal films are formed by the electrodeless plating described above, it is possible to greatly reduce the number of steps than the steps shown in FIGS. 3A through 3M, as well as the steps shown in FIGS. 4A through 4D. As the solution for the electrodeless plating may be used ATOMEX (trade name) sold by Engechard Co.

Although in the foregoing description, as the insulating film was used a silicon oxide film it may be substituted by any insulating film, for example a silicon nitride film.

Furthermore, the mask pattern metal films 70, 81, 105, 106, 120a and 120b were formed in the presence of a photoresist layer (for example 68b shown in FIG. 3F) the presence of the photoresist layer is not essential to form the mask pattern metal films. However when the mask pattern metal films are formed in the absence of the photoresist layer the portions of the metal films projecting beyond the polycrystalline silicon body will not be horizontal but directed slightly toward lower. However, since it is only necessary that the mask pattern metal film should project laterally from the lower end of the polycrystalline silicon body and that the metal film should not contact the base electrode formed on the semiconductor substrate, the photoresist layer may be provided if desired when forming the mask pattern metal film.

Figure 3N:
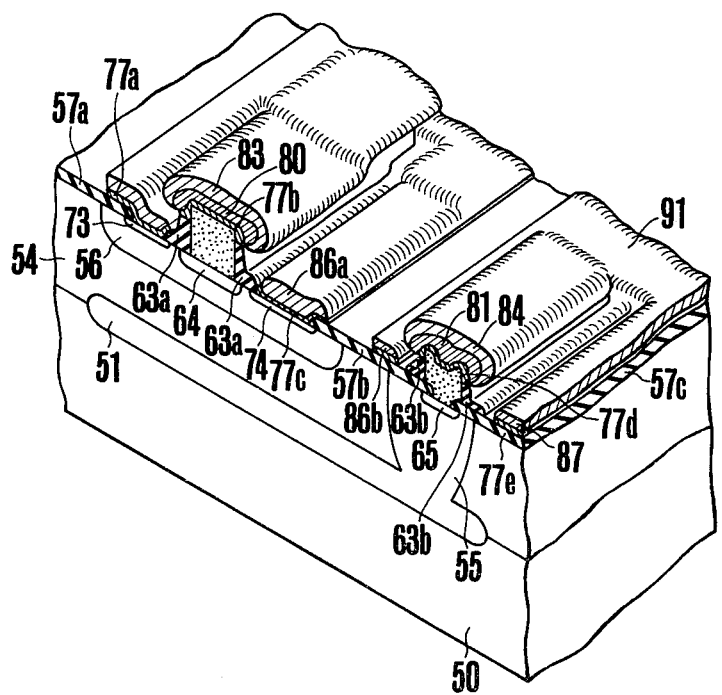
Figure 4D:
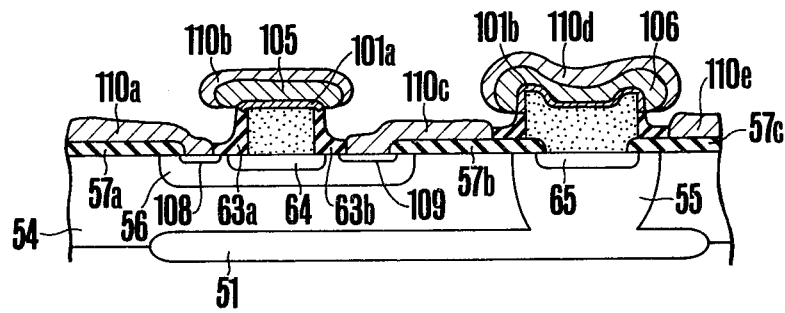

In this manner, it is possible to manufacture a transistor similar to that prepared by the process steps shown in FIGS. 3A through 3N without using a photoresist layer such as 68b shown in FIG. 3F. More particularly a polycrystalline silicon semiconductor layer 60 as shown in FIG. 3A is prepared, a metal layer is formed on the polycrystalline silicon bodies 60a and 60b are formed by using etchant resistant patterns 61a and 60b as shown in FIG. 3A. At this time, since the top surfaces of the polycrystalline silicon bodies are covered by the metal films, no oxide film is formed but the surface of the metal films on the polycrystalline silicon bodies are etched to remove the oxidized portion. At this time, since the other portions are covered by the oxide film formed by heat treatment, they will not be eroded by the etchant for the metal films. Then a mask pattern metal film is formed on said metal film by electrodeless plating and an impurity is diffused into the base contact by the ion implantation process. When the thickness of silicon oxide film 57 is made larger than that of the silicon oxide film 63, it is possible to control the implantation energy such that, at the portion where the oxide film 57 presents, impurity ions will not implant into the semiconductor substrate but reach only to the surface of the oxide film 57. With this method of ion implantation, it is possible to diffuse the impurity ions into the portion of the semiconductor substrate which underlies the mask pattern metal film and where the silicon oxide film 57 formed by heat treatment does not present. When an ion implanted oxide film is compared with an oxide film not implanted with impurity ions the etching speed of the former is several times larger. By using this characteristic, it becomes possible to selectively etch off the insulating silicon oxide film 63 except its portion underlying the mask pattern metal film. Accordingly, it is possible to obtain a transistor having a construction as shown in FIG. 3N by vapor depositing the base electrode and by using the process step shown in FIG. 3M.

Figure 6A:
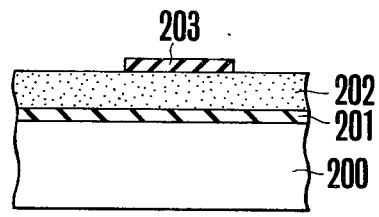
FIGS. 6A through 6D are sectional views, partly in perspective, showing successive steps of manufacturing resistors and inside wirings of an integrated circuit embodying the invention.

A method of forming resistors and inner wirings when the invention is applied to the manufacture of a high density LSI will now be described. FIG. 6A shows the first step of the method of manufacturing the resistors and the inner wirings, in which reference numeral 200 shows a silicon wafer, 201 a silicon oxide film formed by heat treatment and overlying the wafer 200, 202 a polycrystalline silicon layer formed on the silicon oxide film 201 and 203 an etchant resistant pattern. The material and construction of these elements are the same as those of the transistor described above.

Figure 6B:
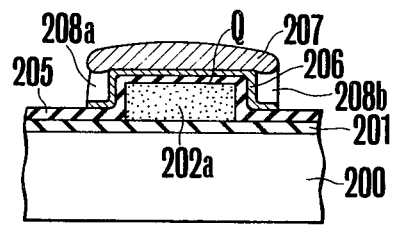

The silicon wafer shown in FIG. 6A is subjected to the steps shown in FIGS. 3B through 3G to obtain a construction shown in FIG. 6B. For the purpose of forming a resistor with the polycrystalline silicon layer 202 in contact with the silicon oxide film 201 on the silicon wafer 200, a polycrystalline silicon body 202a is shaped as a frustrum and on the surface of the polycrystalline silicon body 202a are formed an insulating silicon oxide film 205, a plating prime metal film 206 and a mask pattern metal film 207, and portions 208a and 208b of the metal film 206 underlying the mask pattern metal film 206 and not protected by a photoresist are removed by etching.

Figure 6C:
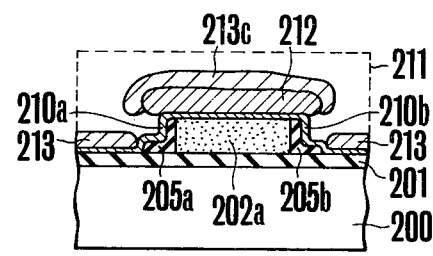

The construction shown in FIG. 6C is obtained by subjecting the wafer shown in FIG. 6B to the steps shown in FIGS. 3H through 3L. Briefly stated, the portions of the silicon oxide film 205 underlying the mask pattern metal film 207 and not protected by the photoresist film are removed by etching. Thereafter, the mask pattern metal film 207, the photoresist film and the plating prime metal film 206 underlying the mask pattern metal film 207 are removed and the silicon oxide film on the top Q of the polycrystalline silicon body 202a in the form of a frustum is also removed thus preserving the portions 205a and 205b of the silicon oxide film on the side surfaces of the frustum. Then, a wiring metal film 210 (not shown) is formed on the all surface of the silicon wafer and a relatively thick photoresist film 211 is coated such that the top Q of the polycrystalline silicon body 202a is exposed. Then, a resistor electrode 212 is electroplated on the exposed top Q by using the wiring film an inner wiring metal films 213a and 213b are vapor deposited by using the electrode 212 as a mask. At the same time, a resistor metal film 213c is also formed on the electrode 212.

Figure 6D:
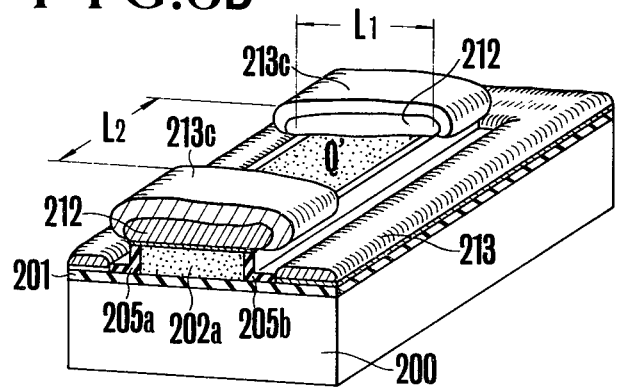

Then the inner wiring metal films 213a and 213b, and the inner wiring metal films 210a and 210b not covered by the resistor metal film 213c are removed and these portions are covered by a thick photoresist film. An area of the photoresist film having a width L₁ and a length L₂ on the resistor metal is exposed to light and then developed, this exposing the resistor metal film 213c in that area. Then the resistor metal film 213c in this area, the resistor electrode 212 and the wiring metal film 210 are etched off to expose the top Q' of the frustum shaped polycrystalline silicon body 202a as shown in FIG. 6D (remaining portion of the photoresist film is not shown). The frustum shaped polycrystalline silicon body 202a is used as a resistor and the resistor metal films 213c constitute the terminals of this resistor.

Further, portions 213a and 213b are used as the inner wiring conductors when the wafer is used as an integrated circuit.

In the foregoing description, the steps of manufacturing a transistor and inner wirings were described with reference to FIGS. 3A through 3N, FIGS. 4A through 4D and FIGS. 5A and 5B while the steps of manufacturing a resistor and inner wirings were described with reference to FIGS. 6A through 6D. To form an integrated circuit including a resistor and inner wirings on the same wafer, the resistor and the inner wirings are formed by the steps shown in FIG. 6c, and the transistor by the steps shown in FIGS. 3M and 3N. Accordingly, an integrated circuit will be completed by forming an insulating film having a thickness of about one micron on the silicon wafer, forming perforations through the insulating film which are necessary to make connections necessary to form a desired circuit and by forming wirings with a metal film.

Although not described, it will be clear that a transistor, a resistor and inner wirings can also be formed by the methods shown in FIGS. 4A through 4D and FIGS. 5A and 5B.

Figure 7:
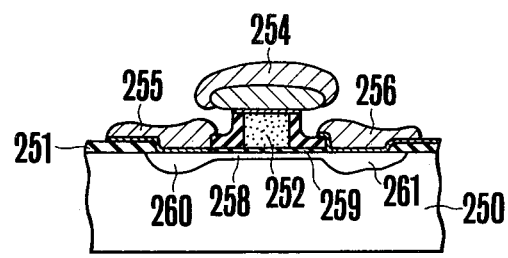
FIG. 7 shows a sectional view of a portion of a MOS transistor embodying the invention and FIGS. 8A through 8C are sectional views showing the relationship between a polycrystalline silicon body and a metal mask useful to explain the invention.

FIG. 7 is a sectional view showing the invention as applied to n channel type MOS transistor. The MOS transistor comprises a P type silicon wafer 250 having a resistivity of 0.5 to 1 ohm-cm a silicon oxide film 251 prepared by heating, a gate polycrystalline silicon body 252, a gate electrode 254, a source electrode 255, a drain electrode 256, a P type impurity diffused layer 258 containing a P type impurity, for example boron at a low density ($1 \times 10^{17}/cm^3$), a gate silicon oxide film 259 having a thickness of about 0.1 micron and formed on the diffused layer 258, and source and drain electrodes 260 and 261 formed by heat-diffusing or implanting into the P type silicon wafer 250, such n type impurity as arsenic or phosphor. Such MOS transistor can readily be formed by the steps shown in FIGS. 3A through 3M and respective electrodes can be insulated from each other by microgaps formed by self-aligning.

The embodiment described above relates to an integrated circuit including a n-p-n type transistor, a MOS transistor and their method of manufacturing. It will be clear that the invention is also applicable to p-n-p type transistor as well as various diodes and that the semiconductor material is not limited to silicon, and germanium and intermetallic compounds, for example antimony-arsenide, and gallium-arsenide, etc. can also be used.

Figure 8A:
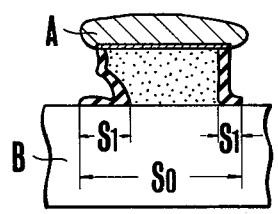
Figure 8B:
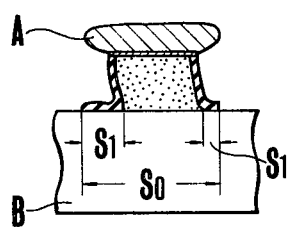
Figure 8C:
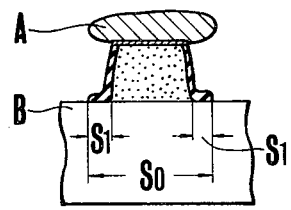

The method of this invention for manufacturing a semiconductor device having a step shaped (nail head shaped) electrode is characterized by an improved yield. More particularly, in the prior art semiconductor device, the sectional configuration of the polycrystalline silicon body is limited to inverted frustum whereas the sectional configuration of the polycrystalline silicon body of this invention is irregular as shown in FIGS. 8A, 8B and 8C. Even with these irregular configurations, it is sufficient that the base of the polycrystalline silicon body be included in the vertical projection S₀ of the mask pattern A on a substrate (that is silicon wafer) with a margin S₁. This feature is more advantageous than the prior art stepped electrode construction wherein the polycrystalline silicon body is worked to have an inverted frustum shape by varying the etching speed by adjusting the amount of the impurity contained in the polycrystalline silicon body and the diffusion of the impurity by heat treatment.

By the process steps described above a n-p-n type transistor for use in ultra high frequencies and an integrated circuit utilizing the same can be manufactured. When the pattern of a ultra high frequency transistor of this invention is designed, by setting the minimum dimension at 2 microns, the external base resistance was decreased to ¼ of that of a transistor of a conventional planar construction and the capacitance of the collector-base junction immediately beneath the external base was reduced to ½ of that of the prior art construction showing great improvement of the high frequency characteristics. Although the maximum oscillation frequency of the prior art construction is 7.3 GH$_z$, that of the novel transistor having the same emitter area increases to 13.3 GH$_z$.

As above described, according to this invention it is possible to eliminate regions not necessary to the operation of a prior art transistor and to improve the high frequency characteristics.

Furthermore, according to the method of this invention, it is possible to simplify the photomask pattern utilized to form electrodes and to eliminate the photomask pattern for forming the base contact window. Consequently, these steps which require extremely accurate positioning in the prior art construction are simplified, thus rendering easy manufacture.

Further, according to the method of this invention it is possible to readily form electrodes having a large current capacity and arranged at a high density. The thickness of the metal films utilized for forming emitter and collector electrodes, resistors and electrode wirings can be made to be twice or more of the prior art construction.

The invention is further characterized in that the deviation in the characteristics of the semiconductor devices manufactured by the method of this invention is small. Even when there are some pitch or dimentional errors in the device pattern which is formed on the photomask at the first step, the relative spacing between the emitter and base contacts which has an influence upon the characteristics of the resulting semiconductor device is definite and would not vary depending upon the sectional configuration of the polycrystalline silicon body as in the prior art construction so that it is possible to obtain semiconductor devices having identical characteristics at high yields.

What is claimed is:

1. A method of manufacturing a semiconductor device comprising the steps of forming a polycrystalline silicon semiconductor body at a predetermined position on the surface of a semiconductor substrate, and forming a metal electrode on the top surface of said polycrystalline silicon semiconductor body such that the metal electrode extends in the lateral direction beyond the periphery of top surface of said polycrystalline silicon semiconductor body, and wherein said polycrystalline silicon semiconductor body is formed by the steps of forming a plurality of diffused regions in said semiconductor substrate, said diffused regions constituting a transistor, forming a polycrystalline silicon semiconductor layer having a uniform impurity concentration on said diffused regions and on a first insulating film which is used as a mask for forming said diffused regions, and forming said polycrystalline silicon semiconductor while preserving said polycrystalline silicon semiconductor layer on one of said diffused regions, and wherein said metal electrode is formed by the steps of forming a second insulating film on the entire surface of said semiconductor substrate, applying a first photoresist film upon said second insulating film, exposing the top surface of said polycrystalline silicon body, forming a first prime metal film over the entire surface of said semiconductor substrate under the condition described above, forming a second photoresist film on said first prime metal film, exposing the top surface of said polycrystalline silicon semiconductor body, forming a metal mask pattern on the top surface of said polycrystalline silicon body by applying a voltage to said first prime metal film such that said metal mask pattern extends in the lateral direction beyond the periphery of the top surface of said polycrystalline silicon semiconductor body, removing said second photoresist film and said first prime metal film by using said metal mask pattern as a mask, forming a contact region in the other diffused region adjacent said one diffused region by using said metal mask pattern as a mask, removing said metal mask pattern, said photoresist film and said first prime metal film, applying a third photoresist film on the entire surface of said semiconductor substrate, exposing the top surface of said polycrystalline silicon semiconductor body, removing said third photoresist film, forming a second prime metal film over the entire surface of said semiconductor substrate, forming a fourth photoresist film on said second prime metal film, exposing the second prime metal film on the top surface of said polycrystalline silicon semiconductor body, and forming said metal electrode on the exposed second prime metal film by applying a voltage thereto such that the metal electrode extends in the lateral direction from the periphery of the top surface of said polycrystalline silicon semiconductor body, and said method further comprising the steps of removing said third photoresist film by utilizing said metal electrode as a mask, applying a conductor metal film on said metal electrode and said second prime metal film by applying a voltage on said second prime metal film, and removing remaining third photoresist film, unnecessary conductor metal film and said second prime metal film.

2. The method according to claim 1 wherein the last mentioned step comprises the steps of removing the remaining third photoresist film and the second prime metal film underlying the same, forming a fourth photoresist film on the entire surface of said semiconductor substrate, removing the portion of the photoresist film corresponding to unnecessary conductor metal and the second prime metal film, then removing said unnecessary conductor metal film and said second prime metal film and finally completely removing said fourth photoresist film.

3. A method of manufacturing a semiconductor device comprising the steps of forming a polycrystalline silicon semiconductor body at a predetermined position on the surface of a semiconductor substrate, and forming a metal electrode on the top surface of said polycrystalline silicon semiconductor body such that the metal electrode extends in the lateral direction beyond the periphery of top surface of said polycrystalline silicon semiconductor body, and wherein said polycrystalline silicon semiconductor body is formed by the steps of forming a plurality of diffused regions in said semiconductor substrate which constitute a transistor, forming a polycrystalline silicon semiconductor layer containing an impurity at a uniform concentration on said diffused region and on a first insulating film which is used as a mask for forming said diffused regions, and forming the polycrystalline silicon semiconductor body while preserving said polycrystalline silicon semiconductor layer in one of said diffused region, and wherein said metal electrode is formed by the steps of forming a second insulating film on the entire surface of said semiconductor substrate, forming a first photoresist film on said second insulating film, exposing the top surface of said polycrystalline silicon semiconductor body, removing said first photoresist film, forming a first prime metal film over the entire surface of said semiconductor substrate under the condition described above, exposing the top surface of said first prime metal film, forming a second prime metal film on the entire surface of said semiconductor substrate, forming a second photoresist film on said second prime metal film, and forming said second electrode on the top surface of said polycrystalline semiconductor body by applying a voltage to said second prime metal film such that said metal electrode extends in the lateral direction beyond the periphery of the top surface of said polycrystalline silicon body, and said method further comprising the steps of removing said second photoresist film by using said metal electrode as a mask, forming a conductor metal film on said metal electrode and said second prime metal film by applying a voltage thereto, and removing second photoresist film, unnecessary conductor metal film, and the second prime metal film.

4. A method of manufacturing a semiconductor device comprising the steps of forming a polycrystalline silicon semiconductor body at a predetermined position on the surface of a semiconductor substrate, and depositing a metal electrode on the top surface of said polycrystalline silicon semiconductor body such that the metal electrode extends in the lateral direction beyond the periphery of top surface of said polycrystalline silicon semiconductor body, and wherein said polycrystalline silicon semiconductor body is formed by the steps of forming a plurality of diffused regions in a semiconductor region which constitute a transistor, forming a polycrystalline silicon semiconductor layer containing an impurity at a uniform concentration on said diffused regions and on a first insulating film utilized as a mask at the time of forming said diffused regions, and forming said polycrystalline silicon semiconductor body while preserving said polycrystalline-silicon semiconductor layer on one of said diffused regions, and wherein said metal electrode is formed by the steps of forming a second insulating film on the entire surface of said semiconductor substrate, forming a first photoresist film on said second insulating film, exposing the top surface of said polycrystalline silicon semiconductor body, forming by electrodeless plating said metal electrode on the exposed top surface of said polycrystalline silicon semiconductor such that said metal electrode extends in the lateral direction beyond the periphery of the top surface of said polycrystalline silicon semiconductor body, and said method further comprising the steps of removing said first photoresist film by using said metal electrode as a mask, forming a contact region in the other diffused region adjacent said one diffused region by using said metal electrode as a mask, forming a second photoresist film on the entire surface of said semiconductor substrate, and removing a predetermined portion of said second photoresist film to form wiring conductors.

5. A method of manufacturing a semiconductor device comprising the steps of forming a polycrystalline silicon semiconductor body at a predetermined position on the surface of a semiconductor substrate, and forming a metal electrode on the top surface of said polycrystalline silicon semiconductor body such that the metal electrode extends in the lateral direction beyond the periphery of top surface of said polycrystalline silicon semiconductor body, and wherein said polycrystalline silicon semiconductor body is formed by the steps of forming a plurality of diffused regions in a semiconductor substrate which constitute a transistor, forming a polycrystalline semiconductor layer containing an impurity at a uniform concentration on a first insulating film which is used as a mask for forming said diffused regions, and forming said polycrystalline silicon semiconductor body while preserving said polycrystalline silicon semiconductor layer on one of said diffused region, and wherein said meal electrode is formed by the steps of forming a second insulating film on the entire surface of said semiconductor substrate, forming a first photoresist film on said second insulating film exposing the top surface of said polycrystalline silicon semiconductor body, forming a metal film on the entire surface of said semiconductor substrate, forming a mask on a predetermined portion of said metal film, and forming said metal electrode by electrodeless plating on the top surface of said polycrystalline silicon semiconductor body such that said metal electrode extend in the lateral direction beyond the periphery of the top surface of said polycrystalline silicon body, and said method further comprising the steps of removing said first photoresist film, forming a contact region in the other diffused region adjacent said one diffused region by using said metal electrode as a mask, forming a second photoresist film on the entire surface of said semiconductor substrate, and removing a predetermined portion of said photoresist film for forming wiring conductors.

6. A method of manufacturing a semiconductor device comprising the steps of forming a polycrystalline silicon semiconductor body at a predetermined position on the surface of a semiconductor substrate, and forming a metal electrode on the top surface of said polycrystalline silicon semiconductor body such that the metal electrode extends in the lateral direction beyond the periphery of top surface of said polycrystalline silicon semiconductor body, and wherein said polycrystalline silicon semiconductor body is formed by the steps of forming a plurality of diffused regions in a semiconductor substrate which constitute a transistor, forming a polycrystalline silicon semiconductor layer containing an impurity at a high concentration on said diffused regions and a first insulating film which is used as a mask for forming said diffused regions, and forming said polycrystalline silicon semiconductor body while preserving said polycrystalline silicon semiconductor layer on one of said diffused regions, and wherein said metal electrode is formed by the steps of forming a second insulating film on the entire surface of said semiconductor substrate, forming a first photoresist film on said second insulating film, exposing the upper surface of said polycrystalline silicon semiconductor body, forming a first prime metal film over the entire surface of said semiconductor substrate under the condition described above, forming a second photoresist film on said first prime metal film, exposing the top surface of said polycrystalline silicon semiconductor body, and forming said metal electrode on the top surface of said polycrystalline silicon semiconductor body by applying a voltage to said first prime metal film such that said metal electrode extends in the lateral direction beyond the periphery of said top surface, and said method further comprising the steps of removing said second photoresist film, applying a conductor metal on said metal electrode and on a predetermined portion of said semiconductor substrate and removing an intermediate portion of said metal electrode, and said conductor metal for exposing said polycrystalline silicon semiconductor body.

7. A method of manufacturing a MOS transistor comprising the steps of forming source and drain diffused regions on a semiconductor substrate, forming a gate oxide film on the portion of said semiconductor substrate between said diffused regions, forming a polycrystalline silicon semiconductor layer on the entire surface of said semiconductor substrate, selectively removing said polycrystalline silicon semiconductor layer for forming a polycrystalline silicon semiconductor body on said gate oxide film, forming an insulating film over the entire surface of said semiconductor substrate, forming a first photoresist film on said insulating film, exposing the top surface of said polycrystalline silicon semiconductor body, forming a first prime metal film over the entire surface of said semiconductor substrate, again forming said first photoresist film on said first prime metal film, exposing the top surface of said polycrystalline silicon semiconductor body, forming a metal mask pattern on the top surface of said polycrystalline silicon semiconductor body by applying a voltage to said first prime metal film such that said metal mask pattern extends in the lateral direction beyond the periphery of said top surface, removing said first photoresist film and said first prime metal film by using said metal mask pattern as a mask, forming a contact region in said diffused source and drain regions by using said metal mask pattern as a mask, removing said metal mask pattern, removing said first photoresist film and said first prime metal film by using said metal mask pattern as a mask, forming a second photoresist film over the entire surface of said semiconductor substrate, exposing the top surface of said polycrystalline silicon semiconductor body, removing said second photoresist film, forming a second prime metal film over the entire surface of said semiconductor substrate, forming a third photoresist film on said third photoresist film, exposing said second prime metal film overlying the top surface of said polycrystalline silicon semiconductor body, forming a metal electrode on the exposed second prime metal film by applying a voltage thereto such that said metal electrode extends in the lateral direction beyond the periphery of the top surface of said polycrystalline silicon semiconductor body, removing said second photoresist film by using said metal electrode as a mask, applying a conductor metal film on said metal electrode and said second prime metal film by applying a voltage to said second prime metal film, and removing the remaining portion of the second photoresist film, unnecessary portions of said conductor metal film and said second prime metal film.

* * * * *